United States Patent
Citurs

(10) Patent No.: US 8,766,094 B2
(45) Date of Patent: Jul. 1, 2014

(54) GROUNDING ADAPTER FOR SHIELDED CABLE

(75) Inventor: Arnel Berton Citurs, Omaha, NE (US)

(73) Assignee: Lindsay Corporation, Omaha, NE (US)

( * ) Notice: Subject to any disclaimer, the term of this patent is extended or adjusted under 35 U.S.C. 154(b) by 64 days.

(21) Appl. No.: 13/477,326

(22) Filed: May 22, 2012

(65) Prior Publication Data

US 2013/0313015 A1  Nov. 28, 2013

(51) Int. Cl.
*H05K 5/02* (2006.01)
*H02G 3/18* (2006.01)

(52) U.S. Cl.
USPC ............ 174/51; 174/660; 174/664; 174/665; 439/98

(58) Field of Classification Search
USPC ............... 174/355, 664, 665, 660, 51; 439/98
See application file for complete search history.

(56) References Cited

U.S. PATENT DOCUMENTS

| | | |
|---|---|---|
| 3,465,092 A | 9/1969 | Schwartz |
| 3,963,299 A | 6/1976 | Thompson et al. |
| 4,025,145 A | 5/1977 | Shaffer et al. |
| 4,619,487 A * | 10/1986 | Brush, Jr. ........................ 439/98 |
| 5,083,929 A * | 1/1992 | Dalton ............................ 439/98 |
| 5,432,301 A | 7/1995 | Gehring |
| 5,648,639 A * | 7/1997 | Hand .............................. 174/51 |
| 6,376,766 B1 * | 4/2002 | Bartholoma et al. ......... 174/354 |
| 6,670,553 B1 * | 12/2003 | Gretz ............................ 174/664 |
| 7,753,698 B2 | 7/2010 | Fisher |
| 8,143,535 B2 * | 3/2012 | Auray et al. .................. 174/666 |
| 2002/0129958 A1 * | 9/2002 | Petri ........................... 174/65 G |
| 2005/0112921 A1 * | 5/2005 | Lin et al. ........................ 439/98 |

* cited by examiner

*Primary Examiner* — Hung Ngo
(74) *Attorney, Agent, or Firm* — Hovey Williams LLP

(57) ABSTRACT

A grounding adapter to be used with a cable comprises a central band, a plurality of upper extensions, and a plurality of lower extensions. The central band may include an upper side, an opposing lower side, a left side, and an opposing right side to form a rectangle. The upper extensions may be spaced apart and coupled to the upper side of the central band. The lower extensions may be spaced apart and coupled to the lower side of the central band. Each upper extension and lower extension may have an isosceles triangle shape with a first side and a second side of equal length and a rounded corner therebetween. The lower extensions may be offset from the upper extensions such that a space between any two lower extensions aligns with an upper extension.

16 Claims, 7 Drawing Sheets

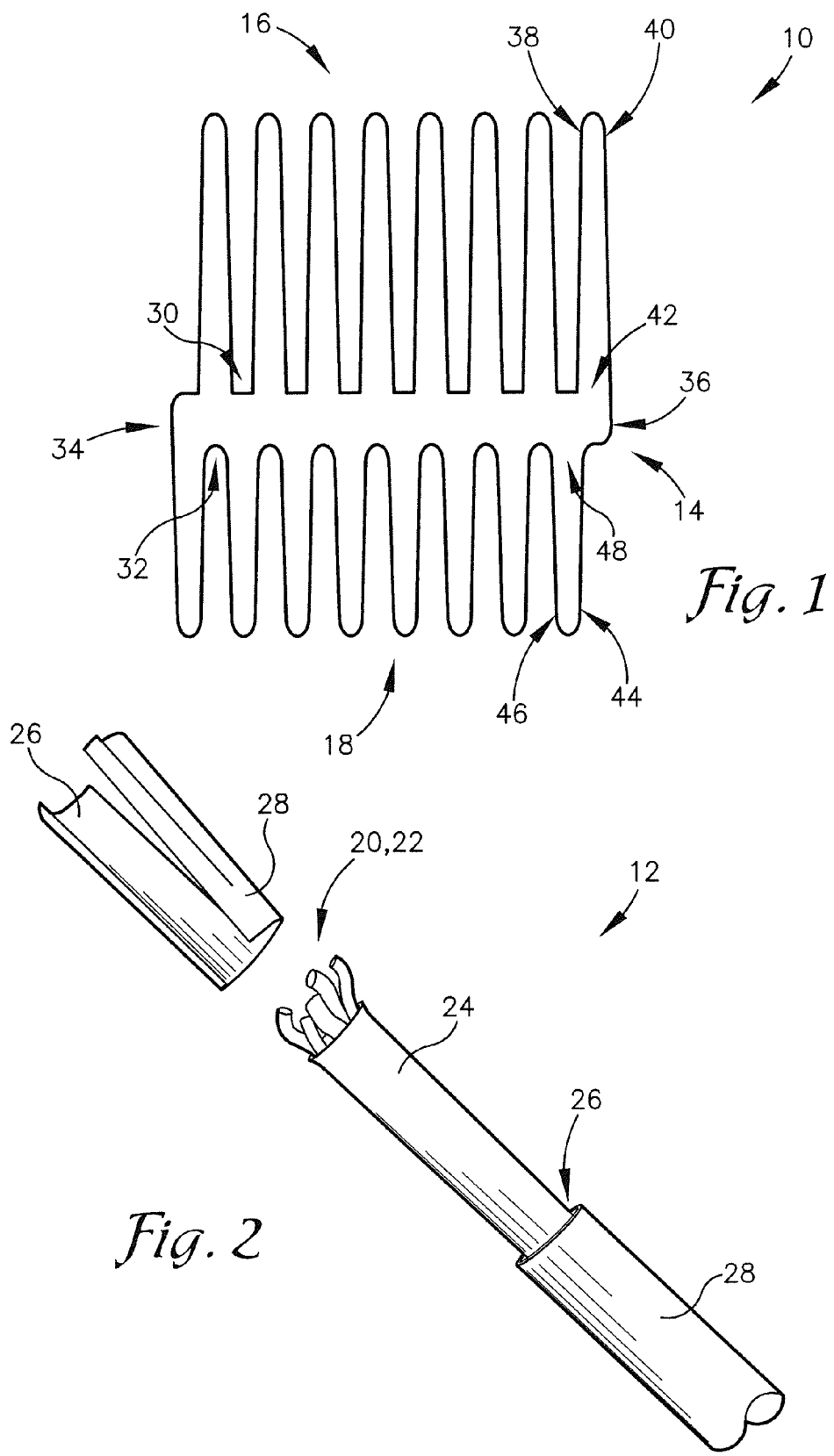

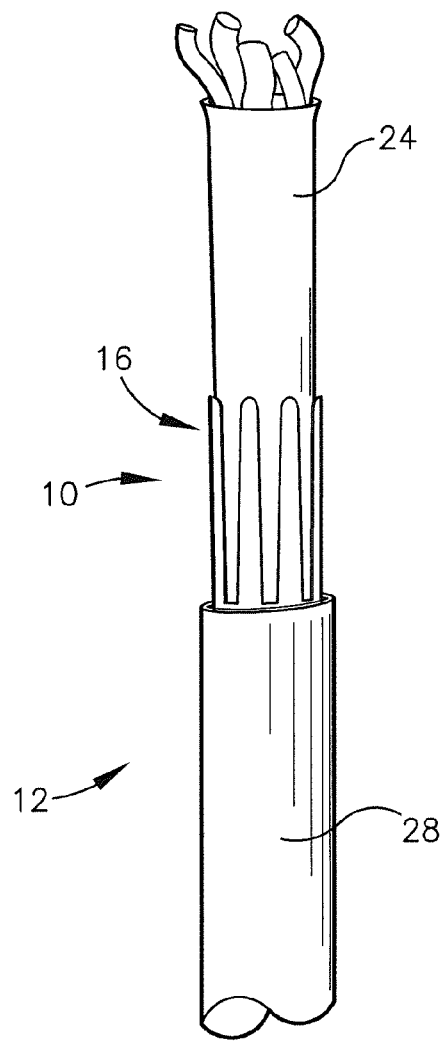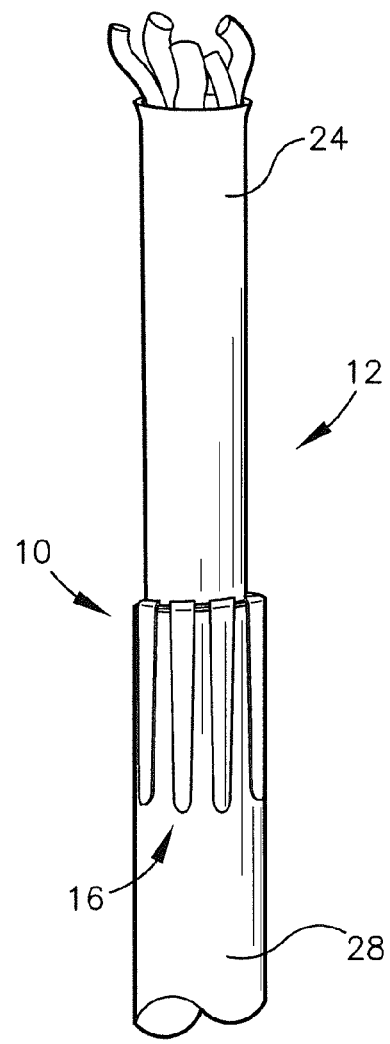
Fig. 5
Fig. 6

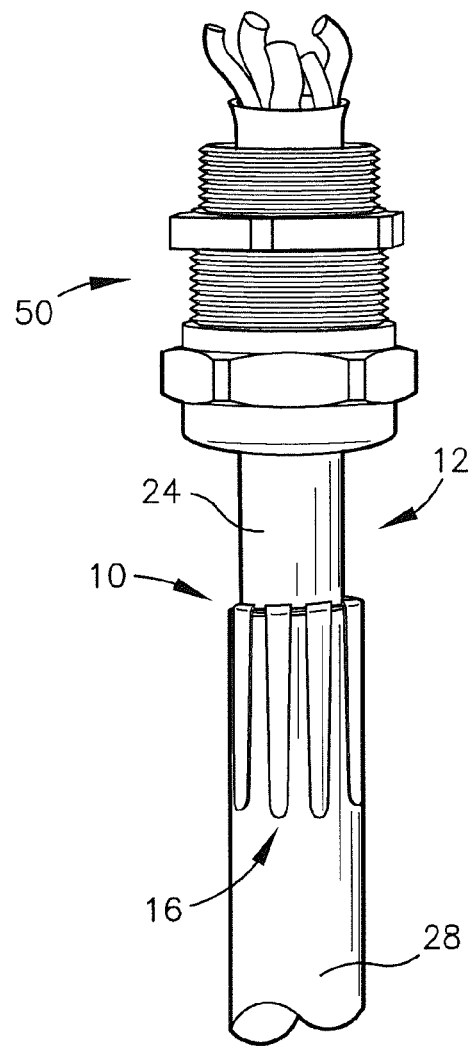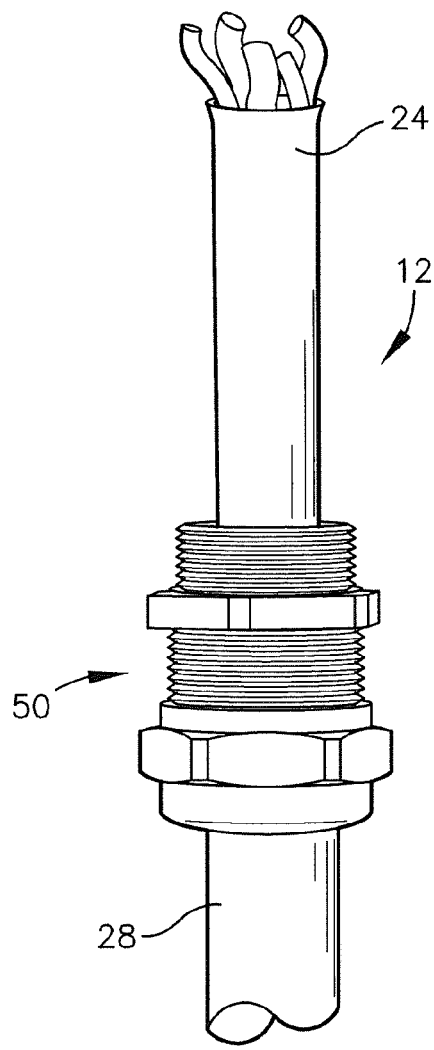
Fig. 7
Fig. 8

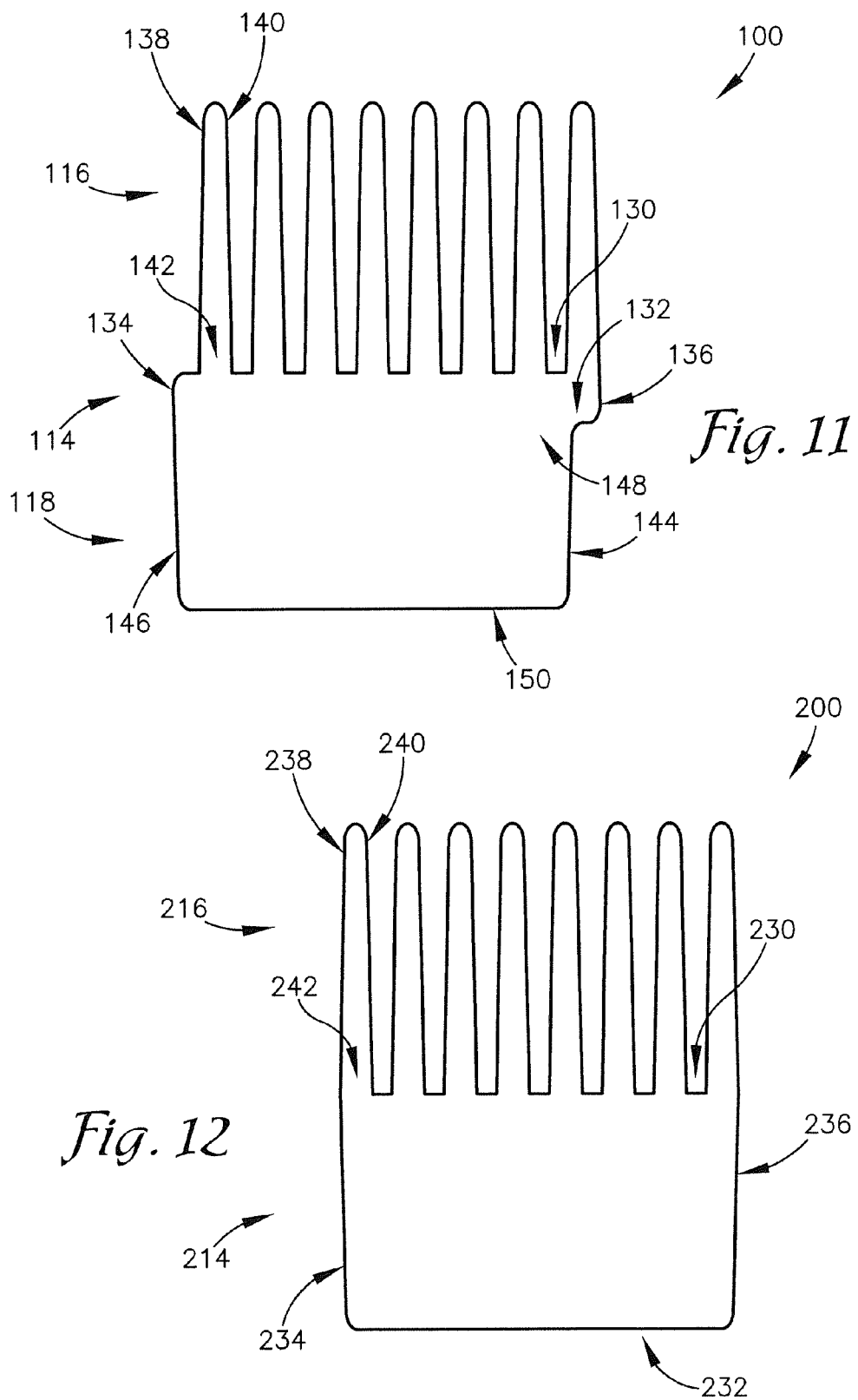

GROUNDING ADAPTER FOR SHIELDED CABLE

FIELD OF THE INVENTION

Embodiments of the present invention relate to grounding devices for shielded electronic communication cables.

DESCRIPTION OF THE RELATED ART

Shielded electronic communication cables generally provide communication between two or more electronic devices. One type of shielded cable is a bonded jacket cable which includes an inner jacket that encompasses a plurality of insulated conductive elements. Surrounding the inner jacket is a metal foil shield which is bonded or adhered to an outer jacket. In order to properly shield the bonded jacket cable, the shield is connected to an electrical ground. However, given that the shield is bonded to the outer jacket, there is no easy way to connect the shield to an electrical ground.

SUMMARY OF THE INVENTION

Embodiments of the present invention solve the above-mentioned problems and provide a distinct advance in the art of grounding shielded electronic communication cables. More particularly, embodiments of the invention provide a grounding adapter for a bonded jacket cable.

The grounding adapter may comprise a central band, a plurality of upper extensions, and a plurality of lower extensions. The central band may include an upper side, an opposing lower side, a left side, and an opposing right side to form a rectangle, wherein the upper side and the lower side are of greater dimension than the left side and the right side. The upper extensions may be spaced apart and coupled to the upper side of the central band. The lower extensions may be spaced apart and coupled to the lower side of the central band. Each upper extension and lower extension may have an isosceles triangle shape with a first side and a second side of equal length and a rounded corner therebetween. The lower extensions may be offset from the upper extensions such that a space between any two lower extensions aligns with an upper extension.

Another embodiment of the present invention provides a bonded jacket cable comprising a plurality of insulated conductive elements, an inner jacket, a shield, an outer jacket, and a grounding adapter. The inner jacket may encompass the insulated conductive elements. The shield may include electrically conductive material and may surround the inner jacket. The outer jacket may be bonded to the shield. On one end of the bonded jacket cable, a portion of the shield and the outer jacket may be removed to expose the inner jacket. The grounding adapter may be wrapped around at least a portion of the exposed inner jacket and may contact the shield. The grounding adapter may be constructed as described above.

Yet another embodiment of the present invention provides a grounding adapter for a bonded jacket cable comprising a central band, a plurality of upper extensions, and a lower extension. The central band may have a rectangular shape including an upper side, an opposing lower side, a left side, and an opposing right side. The upper extensions may be spaced apart and may be coupled to the upper side of the central band. The lower extension may have a rectangular shape and may be coupled to a lower side of the central band, wherein a width of the lower extension is less than the width of the central band.

Still another embodiment of the present invention provides a grounding adapter for a bonded jacket cable comprising a central band and a plurality of upper extensions. The central band may have a rectangular shape including an upper side, an opposing lower side, a left side, and an opposing right side. The upper extensions may be spaced apart and coupled to the upper side of the central band. Each extension may include a first side and a second side of equal length. The first side of a leftmost upper extension may align with the left side of the central band and the second side of a rightmost upper extension may align with the right side of the central band This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein:

FIG. 1 is a front view of a grounding adapter for use with a bonded jacket cable constructed in accordance with various embodiments of the present invention;

FIG. 2 is a perspective view of an exemplary bonded jacket cable with a portion of a shield and an outer jacket removed;

FIG. 5 is a perspective view of the grounding adapter inserted between the shield and an inner jacket;

FIG. 6 is a perspective view of the grounding adapter positioned between the shield and the inner jacket with a plurality of upper extensions bent over the outer jacket;

FIG. 7 is a perspective view of the bonded jacket cable and the grounding adapter with a gland positioned on the inner jacket;

FIG. 8 is a perspective view of the bonded jacket cable with the gland positioned on the outer jacket in contact with the grounding adapter;

FIG. 11 is a front view of a grounding adapter for use with a bonded jacket cable constructed in accordance with an additional embodiment of the present invention;

FIG. 12 is a front view of a grounding adapter for use with a bonded jacket cable constructed in accordance with an additional embodiment of the present invention.

Figures 3, 4:
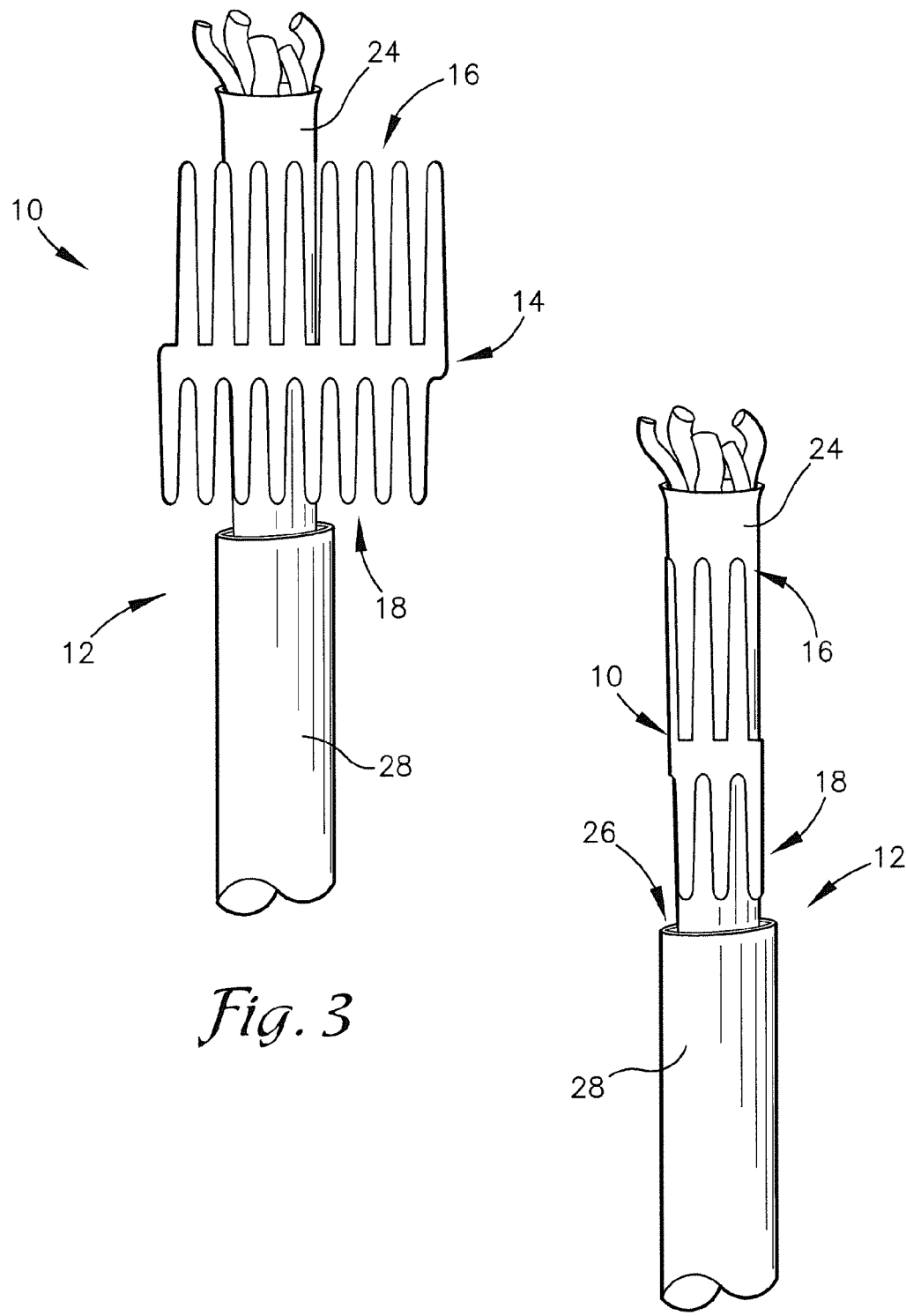
FIG. 3 is a perspective view of the grounding adapter and the bonded jacket cable before the grounding adapter is coupled to the bonded jacket cable.
FIG. 4 is a perspective view of the grounding adapter wrapped around the bonded jacket cable.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

A grounding adapter 10, constructed in accordance with various embodiments of the current invention, for use with a bonded jacket cable 12 is shown in FIG. 1 and broadly comprises a central band 14, a plurality of upper extensions 16, and a plurality of lower extensions 18.

The bonded jacket cable 12, as shown in FIG. 2, is typically utilized in outdoor environments or areas that are exposed to water and may include one or more conductive elements 20, one or more insulating elements 22, an inner jacket 24, a shield 26, and an outer jacket 28. The conductive elements 20 may include wires made from metals such as copper, nickel, aluminum, iron, gold, silver, alloys thereof, and the like. The conductive elements 20 may include a single wire or multiple strands of wire braided or twisted together. The insulating elements 22 may include nonconductive materials such as plastics and rubbers or dielectric materials. Typically, each conductive element 20 has an insulating element 22 that covers, surrounds, or coats it. The inner jacket 24 may include nonconductive materials such as plastics and rubbers or dielectric materials. The inner jacket 24 is generally a tube that encloses all of the insulating elements 22 and, in turn, all of the conductive elements 20.

The shield 26 may include conductive materials in the form of a foil. The foil may be a sheet of material, often aluminum, that is shaped into a tube which surrounds the inner jacket 24. The outer jacket 28 may include nonconductive materials such as plastics or rubbers and may have a tube-like shape. The outer jacket 28 may be extruded onto the shield 26 such that the outer jacket 28 bonds, or otherwise adheres, to the shield 26.

Returning to FIG. 1, the central band 14 of the grounding adapter 10 may be elongated with a generally rectangular shape and may include an upper side 30, a lower side 32, a left side 34, and a right side 36. The upper side 30 and the lower side 32 are generally much greater in dimension than the left side 34 and the right side 36. The corner between the left side 34 and the upper side 30 as well as the corner between the right side 36 and the lower side 32 may be rounded with an exemplary radius of curvature of approximately 0.025 inches. In other embodiments, the rounded corners may be positioned oppositely from what is shown in FIG. 1, i.e., in the upper-right and lower-left corners. The rounded corners serve to prevent the adapter 10 from cutting a technician installing the adapter 10 in the bonded jacket cable 12. The rounded corners further prevent the adapter 10 from cutting the shield 26 or the inner jacket 24 of the bonded jacket cable 12 when the adapter 10 is being inserted therebetween. An exemplary central band 14 may have a width (between the left side 34 and the right side 36) of approximately 2.025 inches and a height (between the upper side 30 and the lower side 32) of approximately 0.15 inches.

The upper extensions 16 may each include a first side 38, a second side 40, and a third side 42 and, as shown in the figures, may have an isosceles triangular shape. The third side 42 may form the base of the triangle at a proximal end of the upper extension 16. The first side 38 and the second side 40 may be of equal length and intersect one another at a distal end of the upper extension 16. The intersection of the first side 38 and the second side 40 may be rounded. The distal end of an exemplary upper extension 16 may have a radius of curvature of approximately 0.05 inches. The height of an exemplary upper extension 16 may be approximately 0.8 inches. In other embodiments, the first side 38 and the second side 40 may be roughly parallel to one another with a rounded or flat connection therebetween at the distal end of the upper extension 16.

The lower extensions 18 may each have a isosceles triangle shape similar to the upper extensions 16, such that each lower extension 18 includes a first side 44, a second side 46, and a third side 48. The intersection of the first side 44 and the second side 46 may be rounded as well. The distal end of an exemplary lower extension 18 may have a radius of curvature of approximately 0.05 inches. The height of an exemplary lower extension 18 may be approximately 0.55 inches. In other embodiments, the first side 44 and the second side 46 may be roughly parallel to one another with a rounded or flat connection therebetween at the distal end of the lower extension 18.

Generally, the upper extensions 16 are of greater height than the lower extensions 18 because the upper extensions 16 are to be wrapped over the outer jacket 28 of the bonded jacket cable 12, as described in more detail below, and have to accommodate the thickness to the outer jacket 28.

The upper extensions 16 may be coupled to the central band 14 such that the third side 42 of each upper extension 16 connects to the upper side 30 of the central band 14. Thus, the first side 38 and the second side 40 of each upper extension 16 form an angle slightly greater than 90 degrees with the upper side 30 of the central band 14. The sharp angle (with no curvature or flaring) between the first and second sides 38, 40 and the upper side 30 of the central band 14 allows each upper extension 16 to be bent more easily and to form a crease along the third side 42, as described in more detail below. The upper extensions 16 may be evenly spaced apart from one another and may have a center to center spacing of approximately 0.2469 inches. An extra space may be provided near the left edge of the upper side 30, although in other embodiments, the upper extensions 16 may be shifted such that the extra space is near the right edge of the upper side 30.

Figure 13:
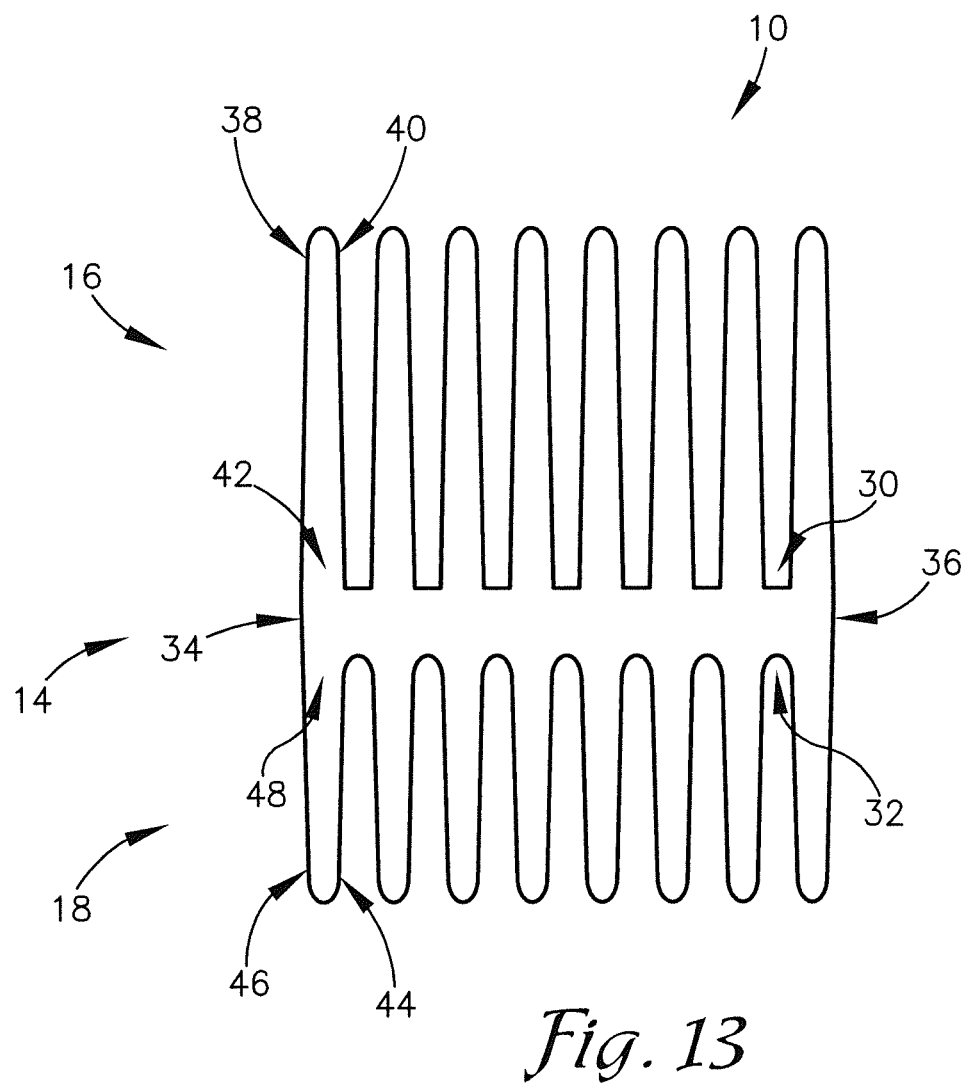
FIG. 13 is a front view of a grounding adapter for use with a bonded jacket cable constructed in accordance with an additional embodiment of the present invention.

The lower extensions 18 may be coupled to the central band 14 such that the third side 48 of each lower extension 18 connects to the lower side 32 of the central band 14. The lower extensions 18 may be evenly spaced apart from one another and an exemplary embodiment may have a center to center spacing of approximately 0.2469 inches. In some embodiments, the lower extensions 18 may be positioned 180 degrees out of phase with the upper extensions 16, such that the center of a lower extension 18 may be aligned with the center of a space between two upper extensions 16. An extra space may be provided near the right edge of the lower side 32, although in various embodiments, the extra space may be near the left edge. In other embodiments, as shown in FIG. 13, the lower extensions 18 may be directly aligned with the upper extensions 16, and the spaces between the lower extensions 18 aligned with the spaces between the upper extensions 16. Between each pair of lower extensions 18, the first side 44 of one lower extension 18 and the second side 46 of the other lower extension 18 may curve or flare outward to form a U shape between the adjacent lower extensions 18. This may provide additional structural strength between the lower extensions 18 and the central band 14 to prevent the lower extensions 18 from separating from the central band 14.

The grounding adapter 10 may be monolithic and formed from metals such as aluminum, copper, nickel, iron, gold, silver, alloys thereof, and the like. An exemplary grounding adapter 10 may have a thickness of approximately 0.01 inches, a height (from the distal end of a lower extension 18 to the distal end of an upper extension 16) of approximately 1.5 inches, and a width (from the left side 34 of the central band 14 to the right side 36 of the central band 14) of approximately 2.025 inches. Ideally, the grounding adapter 10 may be sized to match the size of the bonded jacket cable 12 with which it will be used. Specifically, the width of the central band 14 may be approximately equal to the circumference of the inner jacket 24, such that when the grounding adapter 10 is wrapped around the inner jacket 24, as discussed below, the left side 34 will abut or slightly overlap the right side 36. Generally, the grounding adapter 10 may be scaled from the exemplary dimensions to match the size of the bonded jacket cable 12. For example, the upper extensions 16 and the lower extensions 18 may be narrower and shorter for a smaller cable 12 and wider and taller for a larger cable 12. In addition, the upper extensions 16 may be taller for bonded jacket cables 12 with a thicker outer jacket 28.

The grounding adapter 10 may be utilized as follows. An appropriate length of the outer jacket 28 and shield 26 of a bonded jacket cable 12 may be removed from one end of the cable 12, as shown in FIGS. 2-3, typically by cutting the outer jacket 28 with a blade or specialized cutting tool. The grounding adapter 10 may be wrapped around the exposed inner jacket 24, such that the central band 14 is positioned around the circumference of the inner jacket 24 and the lower extensions 18 and the upper extensions 16 are aligned with the longitudinal axis of the bonded jacket cable 12, as shown in FIG. 4. Furthermore, the lower extensions 18 may be positioned adjacent to and pointing toward the outer jacket 28. The grounding adapter 10 may be pushed along the length of the bonded jacket cable 12 such that the lower extensions 18 become positioned between the shield 26 and the inner jacket 24. The grounding adapter 10 may be pushed in this fashion until the upper side 30 of the central band 14 aligns with the edge of the outer jacket 28, as shown in FIG. 5. The upper extensions 16 may be bent outward from the inner jacket 24 and backward toward the outer jacket 28 until they contact and are roughly flush with the outer surface thereof, as shown in FIG. 6.

The bonded jacket cable 12 may now be integrated with a system, electronic device, or piece of electronic equipment in one of at least two ways. In a first embodiment, a gland 50 may be utilized to integrate the bonded jacket cable 12. The gland 50 is typically constructed from metal to provide mechanical strength but also to be electrically conductive. The gland 50 may have a roughly cylindrical shape with a central axial opening along its length. The gland 50 may be placed on the bonded jacket cable 12 such that the inner jacket 24 is positioned in the opening, as shown in FIG. 7. The gland 50 may be slid toward the grounding adapter 10 until the gland 50 covers the upper extensions 16 that are lying flat against the outer surface of the outer jacket 28, as shown in FIG. 8. The upper extensions 16 generally contact the inner surface of the gland 50, making electrical contact with the gland 50 as well. The gland 50 may be coupled to an enclosure of a piece of electronic equipment in a known fashion. Typically, the enclosure, or at least a portion thereof, is electrically conductive and provides an electrical ground. Thus, the bonded jacket cable 12 may be grounded because the shield 26 contacts the lower extensions 18 of the grounding adapter 10. The upper extensions 16 contact the gland 50, which in turn contacts the grounded enclosure of the electronic equipment.

Figure 9:
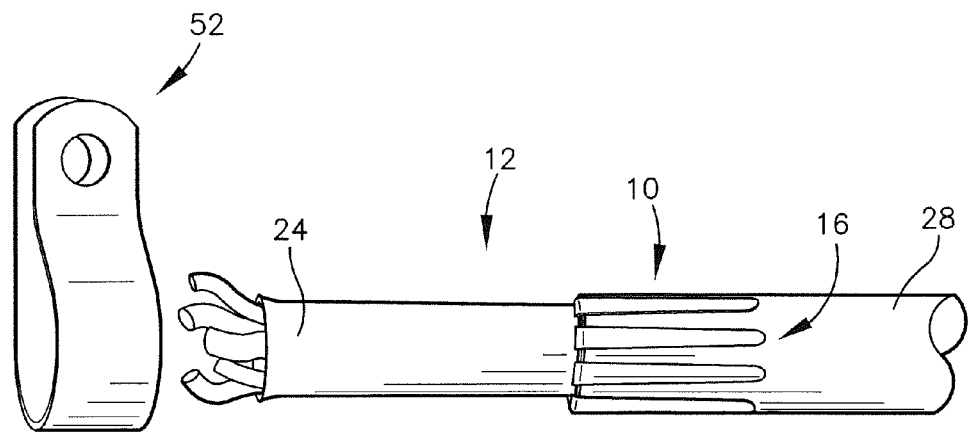
FIG. 9 is a perspective view of a P-clamp with the bonded jacket cable and the grounding adapter.
Figure 10:
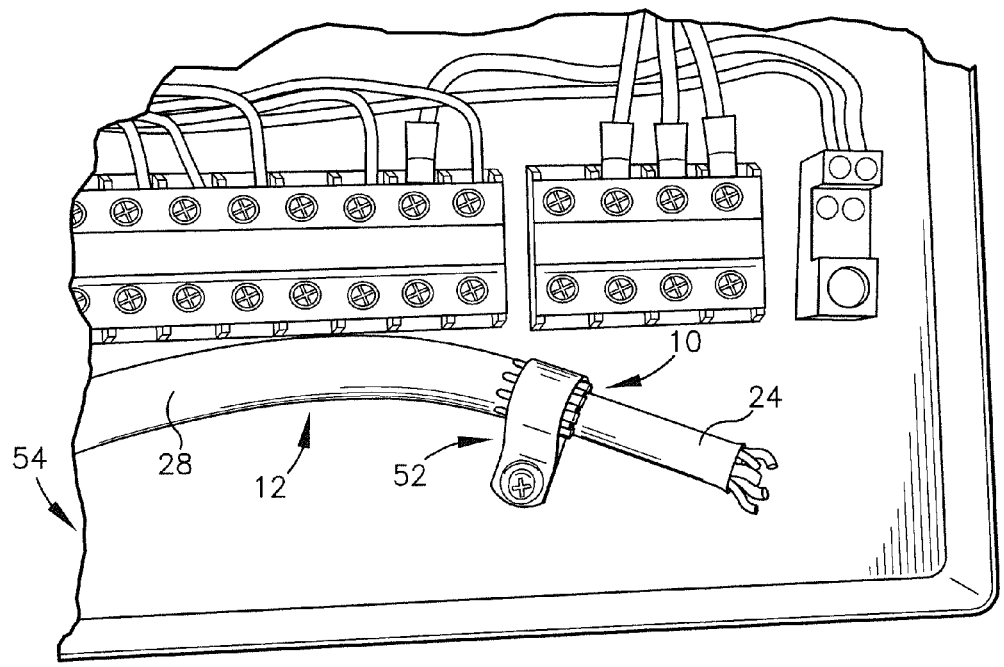
FIG. 10 is a perspective view of the bonded jacket cable attached to a grounded panel by the P-clamp coupled to the grounding adapter.

In a second embodiment, a P-clamp 52 may be utilized to integrate the bonded jacket cable 12. The P-clamp 52 may include a loop with two separable tabs attached thereto to form the shape of a "P", as shown in FIG. 9. The tabs may each include an opening. The P-clamp 52 may be constructed from metal in order to be electrically conductive. The bonded jacket cable 12 may be inserted into the loop such that the loop surrounds and covers the upper extensions 16 of the grounding adapter 10. The P-clamp 52 may then be attached to an electrically conductive component 54, such as a metallic panel, a backplane, a printed circuit board or the like, in the piece of electrical equipment that is coupled to electrical ground. Attachment of the P-clamp 52 may include connecting the tabs to the electrically conductive component 54 with a screw or other fastener, as shown in FIG. 10. Thus, the bonded jacket cable 12 may be grounded because the upper extensions 16 contact the P-clamp 52 which in turn contacts the electrically conductive component 54 coupled to electrical ground.

Another embodiment of the grounding adapter 100 is shown in FIG. 11. The grounding adapter 100 may include a central band 114, a plurality of upper extensions 116, and a single lower extension 118. The central band 114 may be substantially similar to the central band 14 described above and may include an upper side 130, a lower side 132, a left side 134, and a right side 136. The upper extensions 116 may be substantially similar to the upper extensions 16 described above and each may include a first side 138, a second side 140, and a third side 142. The upper extensions 116 may couple to the central band 114 as described above.

The lower extension 118 may occupy the same area as the lower extensions 18 described above, but the lower extension 118 does not include any spaces. Thus, the lower extension 118 may include a right side 144, an opposing left side 146, an upper side 148, and an opposing lower side 150 with a general rectangular shape. In various embodiments, the right side 144 and the left side 146 may taper inward toward one another as they intersect the lower side 150. The corners between the right side 144, the lower side 150, and the left side 146 may be rounded. In addition, the width of the lower extension 118 may be less than the width of the central band 114.

The upper side 148 of the lower extension 118 may couple to the lower side 132 of the central band 114. The left side 146 of the lower extension 118 may align with the left side 134 of the central band 114. However, the right side 144 of the lower extension 118 may be inset from the right side 136 of the central band 114, such that the right side 144 couples with the lower side 132, having a rounded corner therebetween. In other embodiments, the lower extension 118 may be shifted to the right such that the left side 146 of the lower extension 118 is inset from the left side 134 of the central band 114 and the right sides 136, 144 are in alignment.

The grounding adapter 100 may be utilized in a substantially similar manner as the grounding adapter 10 described above. If necessary, the outer jacket 28 and the shield 26 of the bonded jacket cable 12 may be cut a short distance along the length before the lower extension 118 is inserted between the shield 26 and the inner jacket 24. This may make it easier to insert the lower extension 118 since it has more material than the lower extensions 18 of the grounding adapter 10. The grounding adapter 100 may be pushed between the shield 26 and the inner jacket 24 until the upper side 130 of the central band 114 aligns with the edge of the outer jacket 28. The upper extensions 116 may be bent back over the outer jacket 28 as discussed above. Then, the bonded jacket cable 12 with the grounding adapter 100 may be integrated in a system, electronic device, or piece of electronic equipment, as described above.

Yet another embodiment of the grounding adapter 200 is shown in FIG. 12. The grounding adapter 200 may include a central band 214 and a plurality of upper extensions 216. The upper extensions 216 may be substantially similar to the upper extensions 16 described above and each may include a first side 238, a second side 240, and a third side 242.

The central band 214 may have a generally rectangular shape with an upper side 230, a lower side 232, a left side 234, and a right side 236. The left side 234 and the right side 236 may be elongated as compared with the left side 34 and the right side 36 of the grounding adapter 10. In various embodiments, the corners between the left side 234, the lower side 232, and the right side 236 may be rounded. The upper extensions 216 may couple with the central band 214 as described above, except that the first side 238 of the leftmost upper extension 216 may align with the left side 234 of the central band 214. In addition, the second side 240 of the rightmost upper extension 216 may align with the right side 236.

The grounding adapter 200 may be utilized in a substantially similar manner as the grounding adapter 100 described above. If necessary, the outer jacket 28 and the shield 26 of the bonded jacket cable 12 may be cut a short distance along the length. The lower side 232 of the central band 214 may be inserted between the shield 26 and the inner jacket 24. The grounding adapter 200 may be pushed between the shield 26 and the inner jacket 24 until the upper side 230 of the central band 214 aligns with the edge of the outer jacket 28. The upper extensions 216 may be bent back over the outer jacket 28 as discussed above. Then, the bonded jacket cable 12 with the grounding adapter 200 may be integrated in a system, electronic device, or piece of electronic equipment, as described above.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A grounding adapter to be used with a cable, the grounding adapter comprising:
a central band including a left side, an opposing right side, an upper side, and an opposing lower side that form a rectangle;
a plurality of upper extensions spaced apart and coupled to an upper side of the central band each upper extension having a first side and a second side of equal length; and
a plurality of lower extensions spaced apart and coupled to a lower side of the central band, each lower extension having a first side and a second side of equal length, the lower extensions being offset from the upper extensions such that a space between any two lower extensions aligns with an upper extension.

2. The grounding adapter of claim 1, wherein
each upper extension has an isosceles shape with a rounded corner between the first side and the second side, and
each lower extension has an isosceles shape with a rounded corner between the first side and the second side.

3. The grounding adapter of claim 1, wherein a corner between the upper side and either the left side or the right side is rounded.

4. The grounding adapter of claim 1, wherein a corner between the lower side and either the left side or the right side is rounded.

5. The grounding adapter of claim 1, wherein the upper extensions are positioned such that an upper extension is aligned with either the right side or the left side and a space is aligned with the opposing side.

6. The grounding adapter of claim 1, wherein the lower extensions are positioned such that a lower extension is aligned with either the right side or the left side and a space is aligned with the opposing side.

7. The grounding adapter of claim 1, wherein the first side and the second side of the lower extensions curve outward where they intersect with the lower side of the central band, thereby forming a U shape between any two adjacent lower extensions.

8. The grounding adapter of claim 1, wherein the upper extensions have a greater height than the lower extensions.

9. The grounding adapter of claim 1, wherein the grounding adapter is a monolithic unit constructed from metallic material.

10. A grounding adapter to be used with a cable, the grounding adapter comprising:
a central band with a rectangular shape including an upper side, an opposing lower side, a left side, and an opposing right side;
a plurality of upper extensions spaced apart and coupled to the upper side of the central band; and
a single lower extension with a rectangular shape coupled to a lower side of the central band, wherein a width of the lower extension is less than the width of the central band, and is approximately equal to the width from a left edge of a leftmost upper extension to a right edge of a rightmost upper extension.

11. The grounding adapter of claim 10, wherein each upper extension has an isosceles triangle shape with a first side and a second side of equal length and a rounded corner therebetween.

12. The grounding adapter of claim 10, wherein the upper extensions are positioned such that an upper extension is aligned with either the right side of the central band or the left side of the central band and a space is aligned with the opposing side.

13. The grounding adapter of claim 10, wherein a corner between the upper side of the central band and either the left side or the right side of the central band is rounded and a corner between the lower side of the central band and either the left side or the right side of the central band is rounded.

14. A grounding adapter to be used with a cable, the grounding adapter comprising:

a central band including an upper side, an opposing lower side, a left side, and an opposing right side, wherein the lower side is of shorter length than the upper side, and the left side and the right side are angled inward as they connect from the upper side to the lower side; and a plurality of upper extensions spaced apart and coupled to the upper side of the central band, wherein each upper extension includes a first side and a second side of equal length and the first side of a leftmost upper extension aligns with the left side of the central band and the second side of a rightmost upper extension aligns with the right side of the central band, wherein the central band and the upper extensions are formed from a thin metallic material to allow the grounding adapter to be curved about an axis aligned with the lengths of the upper extensions.

15. The grounding adapter of claim 14, wherein each upper extension has an isosceles triangle shape with a rounded corner between the first side and the second side.

16. The grounding adapter of claim 14, wherein the corners between the left side, the lower side, and the right side of the central band are rounded.

\* \* \* \* \*